(12) United States Patent
Simoun-Ou et al.

(10) Patent No.: US 7,177,333 B2
(45) Date of Patent: Feb. 13, 2007

(54) LASER DIODE DEVICE WITH AN APC INSIDE THE CAP

(75) Inventors: Szutsun Simoun-Ou, Taoyuan County (TW); Hsien-Cheng Yen, Taoyuan County (TW)

(73) Assignee: Arima Optoelectronics Corp., Taoyuan County (TW)

( * ) Notice: Subject to any disclaimer, the term of this patent is extended or adjusted under 35 U.S.C. 154(b) by 243 days.

(21) Appl. No.: 10/870,991

(22) Filed: Jun. 21, 2004

(65) Prior Publication Data

US 2005/0105572 A1    May 19, 2005

(30) Foreign Application Priority Data

Nov. 14, 2003   (TW) ............................... 92220237 U

(51) Int. Cl.
*H01S 3/04*    (2006.01)

(52) U.S. Cl. ......................................... 372/36; 372/34
(58) Field of Classification Search .................. 372/36, 372/38.1, 34
See application file for complete search history.

(56) References Cited

U.S. PATENT DOCUMENTS

| 4,182,977 | A | * | 1/1980 | Stricklin, Jr. ............... 315/158 |
| 5,812,582 | A | * | 9/1998 | Gilliland et al. .......... 372/50.21 |
| 5,835,514 | A | * | 11/1998 | Yuen et al. .................... 372/36 |
| 2004/0081410 | A1 | * | 4/2004 | Aronson et al. .............. 385/92 |

* cited by examiner

*Primary Examiner*—Minsun Oh Harvey
*Assistant Examiner*—Tuan N. Nguyen
(74) *Attorney, Agent, or Firm*—Rosenberg, Klein & Lee

(57) ABSTRACT

A laser diode device of package not greater than 5.6 mm, having an automatic power control circuit directly mounted in a heat sink (or a submount) inside the metal cap thereof to substitute for an external circuit board for driving by voltage instead of current.

3 Claims, 6 Drawing Sheets

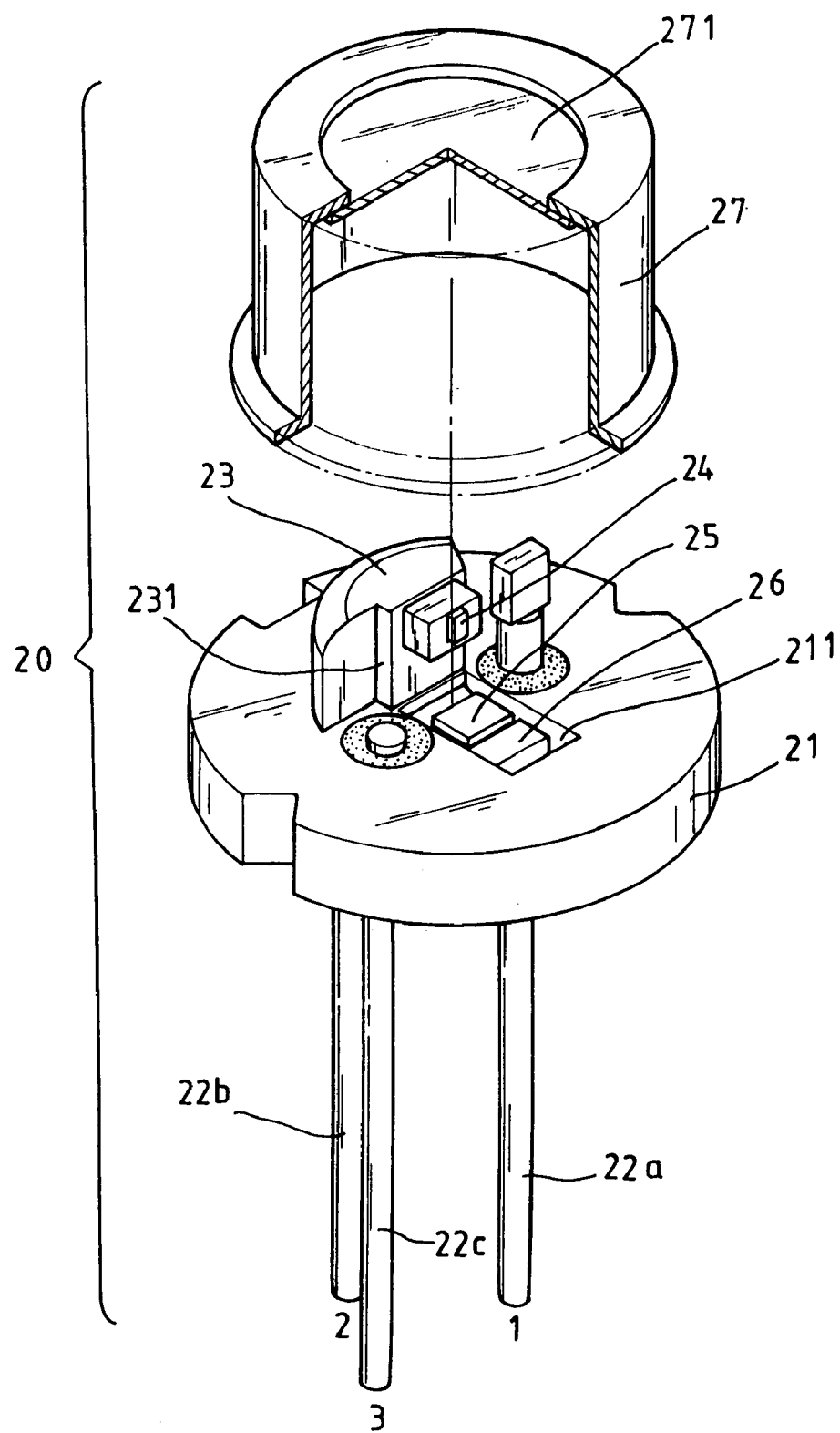
F I G. 2

LASER DIODE DEVICE WITH AN APC INSIDE THE CAP

BACKGROUND OF THE INVENTION a. Field of the Invention

The present invention relates to a laser diode device and, more particularly to such a laser diode device, which has an automatic power control circuit directly encapsulated in the heat sink (or submount) inside the metal cap for driving by voltage instead of current.

b. Description of the Related Art

A laser semiconductor is a kind of diode, also called as a laser diode. Unlike regular diodes, a laser diode has the function of a laser oscillator. Therefore, a laser diode has the electric properties of regular diodes and the optical property of emitting a laser light as a laser oscillator does. A laser oscillator is an object (media) that causes a laser effect. It can be seen in gas form, liquid form, or semiconductor form. Ruby laser device is a solid laser device. Helium-neon laser device is a gas form laser device that emits red laser light. Chromatic laser device is a typical liquid form laser device. These laser generating devices have a big size not less than several tens centimeters that consumes more than several tens of watts for operation. Further, a laser semiconductor is a kind of diode having the size smaller than 1 mm$^3$. Light of about 10 mW can be obtained if a laser semiconductor allows only several +mA direct current to pass in forward bias direction. Therefore, a laser semiconductor can easily be installed in a small apparatus, for example, a CD player or optical communication device. Laser semiconductors have been intensively used in optical communication devices as light source means.

FIG. 1 shows a laser diode device according to the prior art. According to this design, the laser diode device comprises a laser diode 11. The laser diode 11 comprises a heat sink 111 holding a laser diode chip, and a metal cap 112 bonded to the heat sink 111 and internally filed with a dry gas to protect the laser diode chip. When packaged, the laser diode 11 has a diameter about 5.6 mm. Further, the heat sink 111 has three or four pins 113 extended out of the back (bottom) side. The pins 113 of the laser diode 11 are bonded to a circuit board 12, and then assembled with a mount 13, a cover 14 and a spring member 15 to form the desired laser diode device 10. The laser diode 11 of the laser diode device 10 is driven by an electric current obtained from the circuit board 12. According to this design, the circuit board 12 is provided outside the laser diode 11. After installation of the laser diode 11 in the circuit board 12, the photo output of the laser diode 11 must be regulated manually. Further, after the connection of the laser diode 11 to the circuit board 12, the size of the whole assembly is greatly increased. According to this design, the size of the laser diode device 10 is greater than 9 mm, not practical for use in certain small-size products.

SUMMARY OF THE INVENTION

The present invention has been accomplished under the circumstances in view. It is one object of the present invention to provide a laser diode device, which uses a built-in automatic power control circuit (APC) instead of an external circuit board, thereby minimizing the size to below 5.6 mm. It is another object of the present invention to provide a laser diode device, which is driven by voltage instead of current for convenient application.

To achieve these and other objects of the present invention, the laser diode device comprises a heat sink, the heat sink having a front side, a back side, and a plurality of pins respectively extended from the back side for bonding; a mount provided at the front side of the heat sink; a submount disposed at the mount; a laser diode chip and a photo diode chip provided at the front side the heat sink; and a metal cap bonded to the front side of the heat sink; wherein an automatic power control circuit is encapsulated in the metal cap and electrically connected to bonding pins of the heat sink and the laser diode chip and the photo diode chip by wires, the automatic power circuit a first pin and a second pin electrically connected to power+ and power− and a third pin for connection to an external variable resistor.

BRIEF DESCRIPTION OF THE DRAWINGS

FIG. 2 is an exploded view of a laser diode device according to the present invention.

DETAILED DESCRIPTION OF THE PREFERRED EMBODIMENTS

Figure 1:
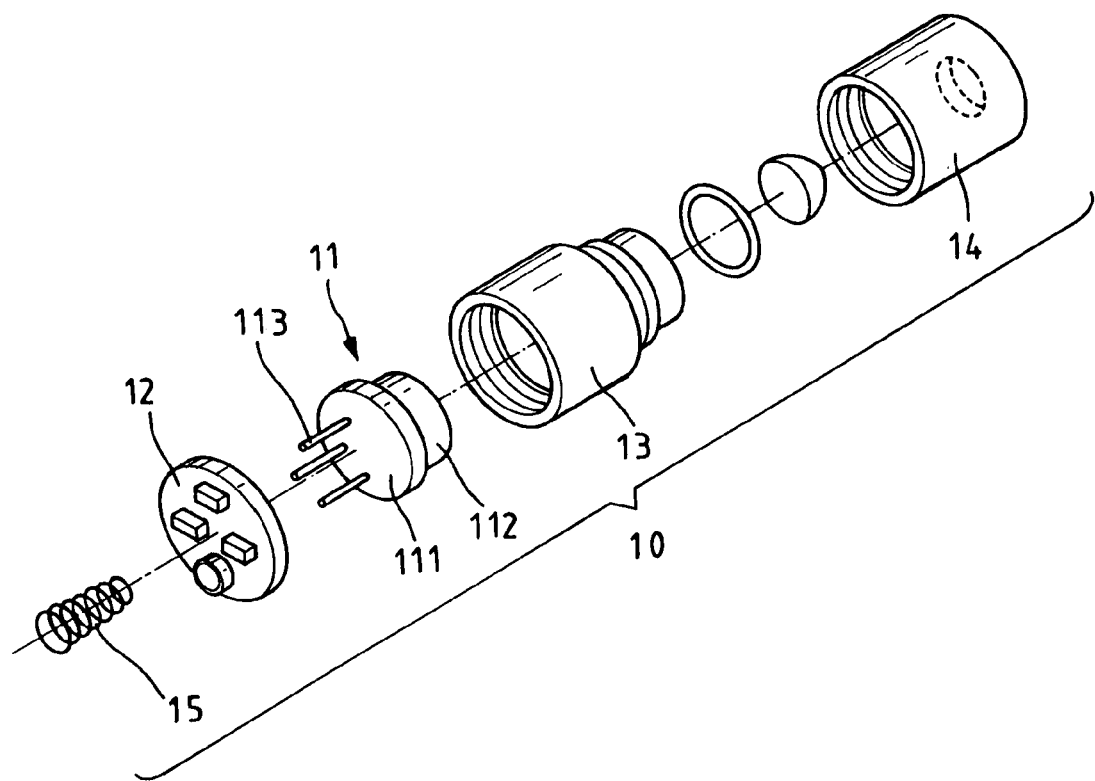
FIG. 1 is an exploded view of a laser diode device according to the prior art.
Figure 3:
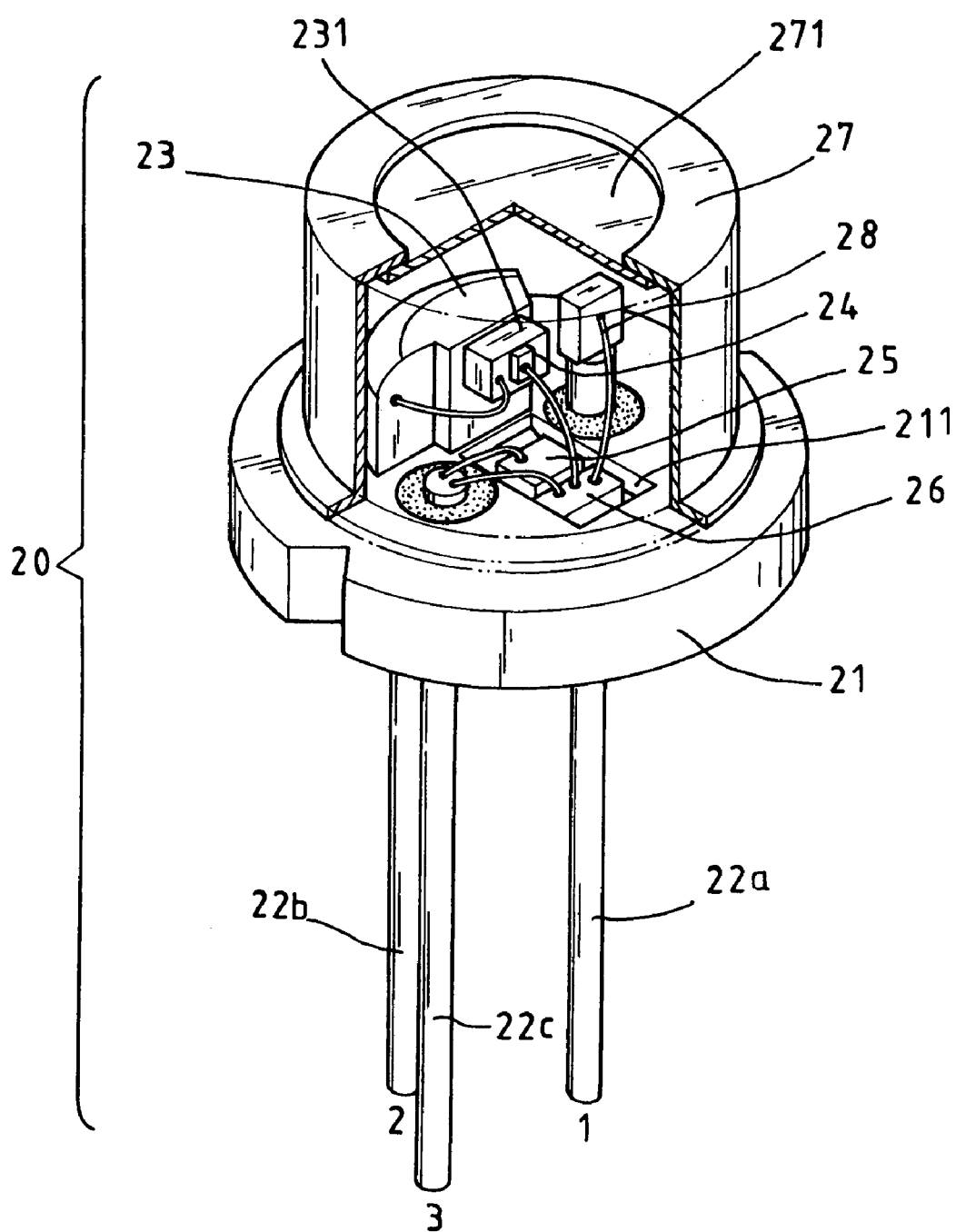
FIG. 3 is a cutaway view of the laser diode device according to the present invention.
Figure 4:
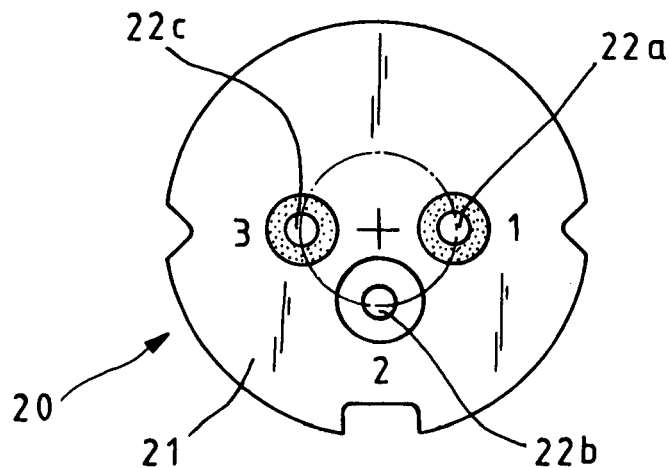
FIG. 4 is a bottom view of the laser diode device according to the present invention.

Referring to FIGS. 2~4, a laser diode device 20 is shown comprising a heat sink 21, which has three pins, namely, the first pin 22a, the second pin 22b and the third pin 22c respectively extended from the back side, a mount (or stem) 23 provided at the front side of the heat sink 21 and connected to the second pin 22b for grounding, a submount 231 formed of a single chip silicon material and disposed at an inner side of the mount 23, a LD (laser diode) chip 24 bonded to the submount 231, a photo diode chip 25 mounted on the front side of the heat sink 21, a metal cap 27, which has a top glass window 271 and a bottom edge bonded to the heat sink 21, and an APC (automatic power control) circuit 26 made in the form of a circuit board or IC and encapsulated in the metal cap 27 and electrically connected to the pins 22a,22b,22c and the LD chip 24 and the PD chip 25 by wires 28 to form a laser diode voltage driving member.

Figure 5:
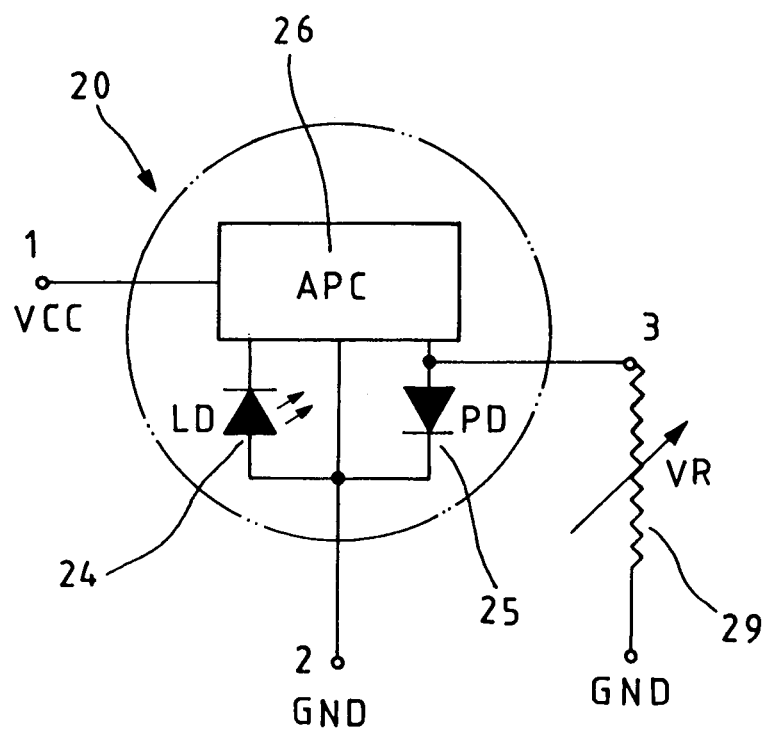
FIG. 5 is a circuit diagram of the laser diode device according to the present invention.

Referring to FIGS. 4 and 5, the APC circuit 26 is encapsulated in the laser diode, having the pins defined as follows:

Pin 1: Vcc (Power+)
Pin 2: GND (Power−)
Pin 3: connected to external VR (variable resistor) 29

As indicated above, the laser diode device 20 does not require an external control circuit, therefore manual photo output regulation procedure is eliminated, improving the productivity. The invention greatly improves the convenience of application of the laser diode device by adopting a voltage-driving design instead of conventional current-driving design. Further, the simplified structural design minimizes the installation space, for enabling the laser diode device to be used in any of a variety of small-size products.

The aforesaid APC circuit 26 can be made in many forms. Normally, an APC circuit 26 uses a PD (photo diode) chip to detect the back beam of the LD (laser diode) and measure its photo power output for controlling biased current of the LD. Because the principle of APC circuit and its electronic component parts are of the known art not within the scope of the claims of the present invention, no further detailed description in this regard is necessary. The main feature of the present invention is to have the APC circuit 26 provided inside the laser diode device, simplifying device design.

Figure 6:
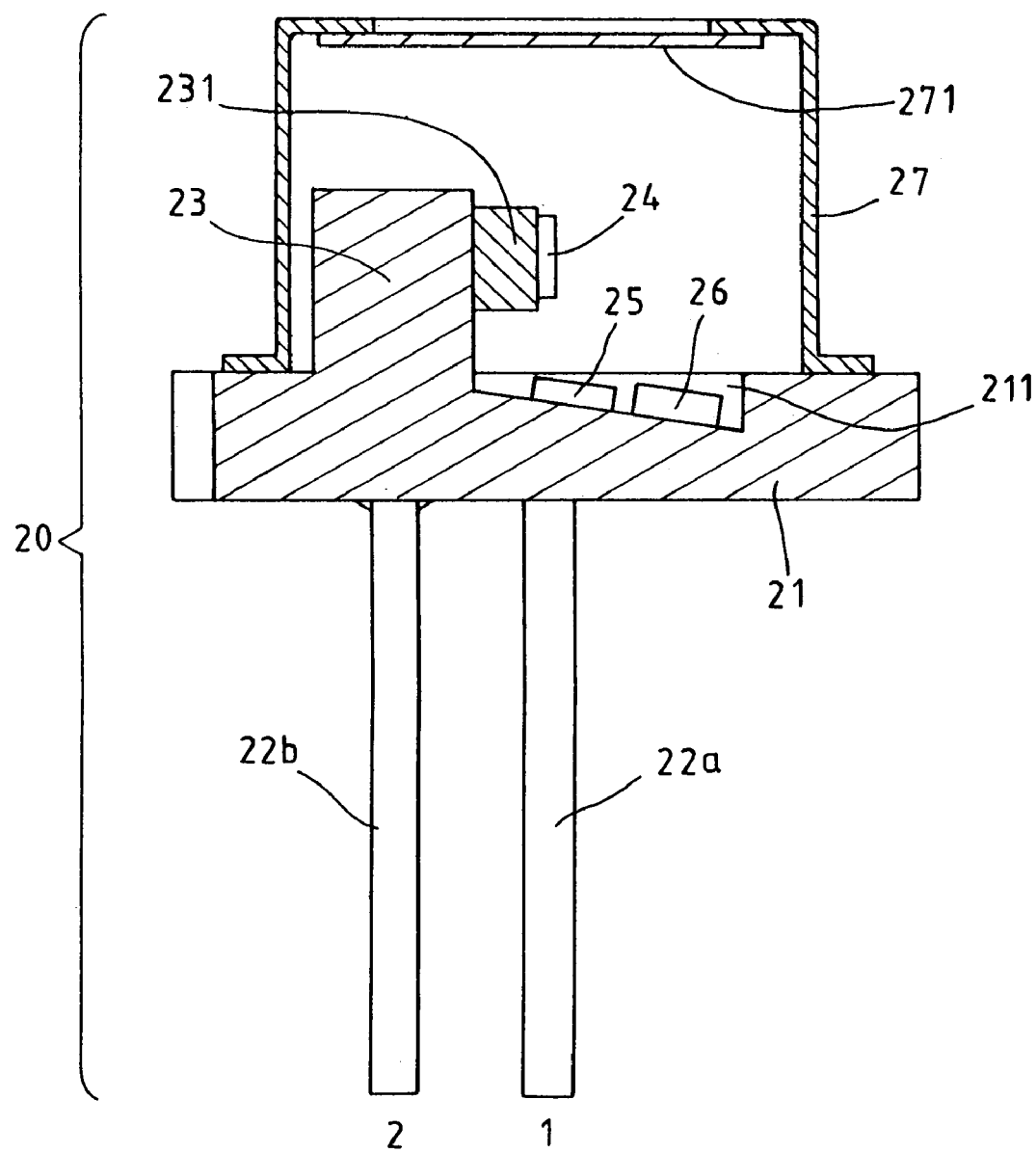
FIG. 6 is a sectional view showing an installation example of the APC in the laser diode device according to the present invention.

The APC circuit 26 can be mounted inside the laser diode device in any of a variety of ways. FIG. 6 shows an installation example of the APC circuit 26. As illustrated, the PD chip 25 is mounted in a recessed hole 211 at the tip side of the heat sink 21, and the APC circuit 26 is also mounted in the recessed hole 211. This mounting design enables the APC circuit 26 to be used with the PD chip 25. Further, the APC circuit 26 can be installed by surface mounting technique without solder.

Figure 7:
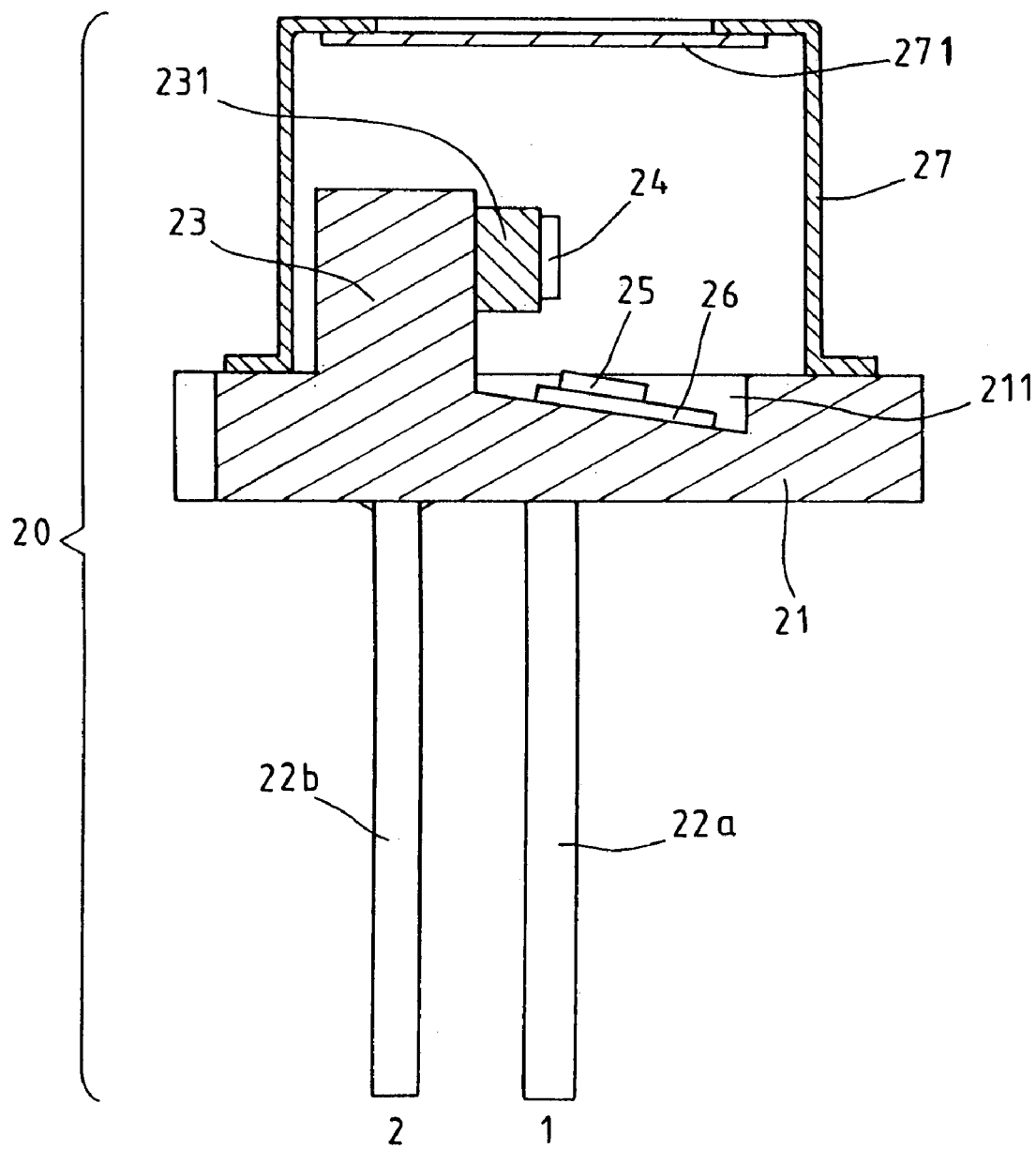
FIG. 7 is a sectional view showing another installation example of the APC in the laser diode device according to the present invention.

FIG. 7 shows another APC circuit installation example. According to this design, the PD chip 25 is mounted with the circuit board of the APC circuit 26 in the recessed hole 211 at the front side of the heat sink 21. This surface mounting design eliminates a further soldering procedure.

In the aforesaid two examples, the APC circuit is built in the laser diode device. When installed in the laser diode device, the device is packaged into a size not greater than 5.6 mm that can be driven by voltage for convenient use.

A prototype of laser diode device has been constructed with the features of FiGS. 2–7. The laser diode device functions smoothly to provide all of the features discussed earlier, Particular embodiments of the invention have been described for the purpose of illustration. However, various modifications and enhancements may be made without departing from the spirit and scope of the invention. Additionally, the invention is not to be limited except as by the appended claims.

What is claimed is:

1. A laser LED device comprising:

a heat sink, said heat sink having a front side, a back side, and a plurality of pins respectively extended from said back side for bonding;

a mount provided at the front side of said heat sink;

a submount disposed at said mount;

a laser diode chip and a photo diode chip provided at the front side said heat sink; and a metal cap bonded to the front side of said heat sink;

wherein an automatic power control circuit is encapsulated in said metal cap and uses said laser diode chip to detect a beam being emitted from a rear end of said laser diode chip and is electrically connected to bonding pins of said heat sink, said laser diode chip, and said photo diode chip by wires, said automatic power circuit is further connected to a first pin and a second pin that are electrically connected to a power+, power− and a third pin for being connected to an external variable resistor; and said laser diode chip is mounted to said submount and said photo diode chip and said automatic power control circuit are mounted in a recessed hole in a front side of said heat sink.

2. The laser diode device as claimed in claim 1, wherein said APC circuit is made in the form of an Integrated circuit (IC).

3. The laser diode device as claimed in claim 1, wherein said laser diode chip is mounted in said submount, said photo diode chip and said automatic power control circuit are bonded together and mounted in a recessed hole in the front side of said heat sink.

\* \* \* \* \*